United States Patent
Mittal et al.

(10) Patent No.: US 9,239,360 B2
(45) Date of Patent: Jan. 19, 2016

(54) DFT APPROACH TO ENABLE FASTER SCAN CHAIN DIAGNOSIS

(71) Applicant: Texas Instruments Incorporated, Dallas, TX (US)

(72) Inventors: Rajesh Kumar Mittal, Bangalore (IN); Charles Kurian, Bangalore (IN); Sumanth Reddy Poddutur, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 102 days.

(21) Appl. No.: 14/165,846

(22) Filed: Jan. 28, 2014

(65) Prior Publication Data
US 2015/0212150 A1    Jul. 30, 2015

(51) Int. Cl.
*G01R 31/3185* (2006.01)

(52) U.S. Cl.
CPC *G01R 31/318552* (2013.01); *G01R 31/318536* (2013.01); *G01R 31/31858* (2013.01); *G01R 31/318541* (2013.01); *G01R 31/318555* (2013.01); *G01R 31/318563* (2013.01)

(58) Field of Classification Search
CPC ............... G01R 31/318541; G01R 31/318555; G01R 31/318536; G01R 31/31858
USPC .......................................... 714/727, 726, 724
See application file for complete search history.

(56) References Cited

U.S. PATENT DOCUMENTS

| | | | |
|---|---|---|---|
| 5,477,545 A * | 12/1995 | Huang ........................ | 714/727 |
| 6,150,842 A | 11/2000 | Agrawal et al. | |
| 7,200,784 B2 | 4/2007 | Dervisoglu et al. | |
| 7,949,916 B1 * | 5/2011 | Ang ............................ | 714/726 |
| 2007/0011542 A1 * | 1/2007 | Mukherjee et al. .......... | 714/738 |
| 2008/0005634 A1 * | 1/2008 | Grise et al. .................. | 714/726 |
| 2012/0124423 A1 | 5/2012 | Chakravadhanula et al. | |

FOREIGN PATENT DOCUMENTS

| | | |
|---|---|---|
| RU | 2316010 C1 | 1/2008 |
| WO | 9522205 A1 | 8/1995 |

* cited by examiner

*Primary Examiner* — James C Kerveros
(74) *Attorney, Agent, or Firm* — John R. Pessetto; Frank D. Cimino

(57) ABSTRACT

A circuit that facilitates faster diagnosis of plurality of logic circuits connected in a scan chain is provided. The circuit includes a first multiplexer that receives a scan data input. A flip-flop is coupled to an output of the first multiplexer and generates a scan pattern. An inverter generates an inverted feedback signal in response to the scan pattern. The inverted feedback signal is provided to the first multiplexer. A plurality of logic circuits is connected in a scan chain and generates a logic output in response to the scan pattern. A bypass multiplexer is coupled to the plurality of logic circuits. The bypass multiplexer generates a scan output in response to the logic output, the scan data input and a segment bypass input.

20 Claims, 3 Drawing Sheets

DFT APPROACH TO ENABLE FASTER SCAN CHAIN DIAGNOSIS

TECHNICAL FIELD

Embodiments of the disclosure relate to integrated circuits and more particularly to diagnosing a scan chain failure in an integrated circuit (IC).

BACKGROUND

Design for test (DFT) approach is a scan chain based design for testing integrated circuits. Scan chain based design is a preferred mechanism for diagnosis of manufacturing defects. Scan chain based diagnosis is fast and efficient for large integrated circuits thus improving the product yield. The scan chain based diagnosis identifies root cause of logic failure in a circuit in the IC. During IC test, the scan chains are also tested to ensure that scan chains are defect free. Any defect in the scan chains become cumbersome to debug. Conventional method of debugging scan chains includes SOM (scanning optical microscopy) or EMMI (emission microscopy). These debugging techniques are expensive and time consuming. Pattern dependent failure diagnosis is also used to debug scan chain defects. Automatic test pattern generation (ATPG) tools are used to generate multiple patterns to be run on the IC. In case of a scan chain failure, design support tools which know the whole design structure are required to use ATPG tools, and these design support tools are not available either. Thus, a design is needed that facilitates faster scan chain diagnosis.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An example embodiment provides a circuit that facilitates faster scan chain diagnosis. The circuit includes a first multiplexer that receives a scan data input. A flip-flop is coupled to an output of the first multiplexer and generates a scan pattern. An inverter generates an inverted feedback signal in response to the scan pattern. The inverted feedback signal is provided to the first multiplexer. A plurality of logic circuits is connected in a scan chain and generates a logic output in response to the scan pattern. A bypass multiplexer is coupled to the plurality of logic circuits. The bypass multiplexer generates a scan output in response to the logic output, the scan data input and a segment bypass input.

Another example embodiment provides a scan chain architecture. The scan chain architecture includes a plurality of segments and each segment further includes a plurality of logic circuits connected in a scan chain. At least one of the segment includes a first multiplexer that receives a scan data input. A flip-flop is coupled to an output of the first multiplexer and generates a scan pattern. An inverter generates an inverted feedback signal in response to the scan pattern. The inverted feedback signal is provided to the first multiplexer. A plurality of logic circuits is connected in a scan chain and generates a logic output in response to the scan pattern. A bypass multiplexer is coupled to the plurality of logic circuits. The bypass multiplexer generates a scan output in response to the logic output, the scan data input and a segment bypass input.

Yet another embodiment provides a method for diagnosing a plurality of logic circuits arranged in a scan chain. A scan data input and an inverted feedback signal are multiplexed to generate a multiplexed output. A scan pattern is generated from the multiplexed output and a divided scan clock. The inverted feedback signal is generated from the scan pattern. The scan pattern is provided to the plurality of logic circuits. The plurality of logic circuits generates a logic output. The logic output and the scan data input are multiplexed to generate a scan output. The plurality of logic circuits is bypassed if the scan output is different from a predefined scan output Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
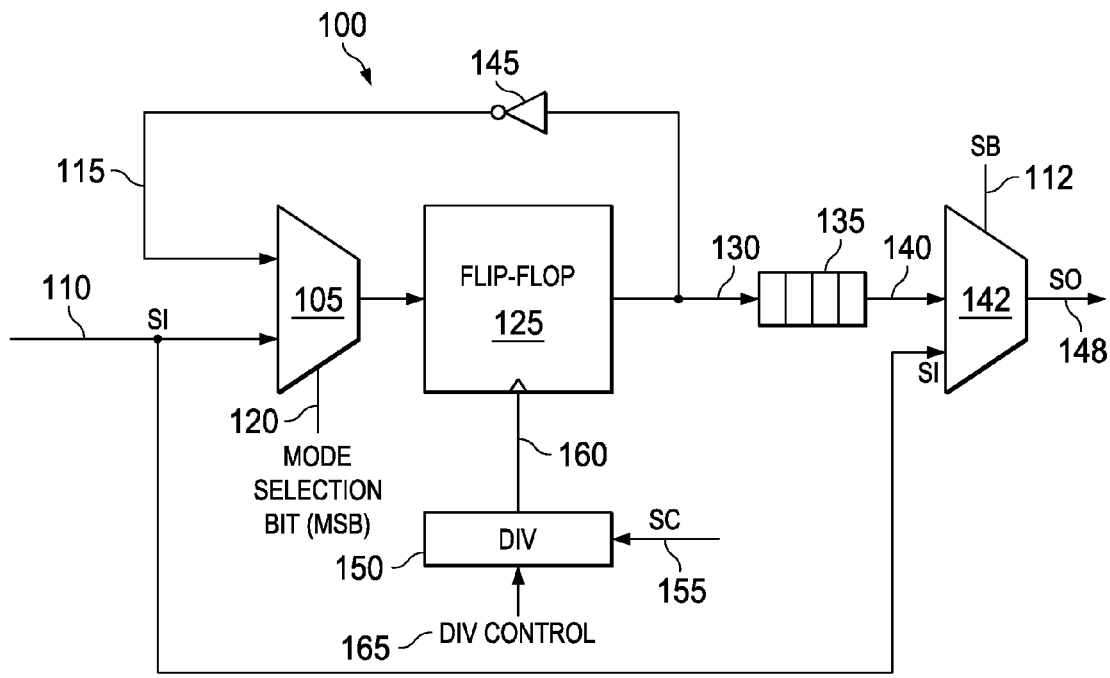
FIG. 1 illustrates a schematic of a circuit for diagnosing a plurality of logic circuits, according to an embodiment.

FIG. 1 illustrates a schematic of a circuit 100 for diagnosing a plurality of logic circuits according to an embodiment. The circuit 100 includes a first multiplexer 105 that receives a scan data input SI 110 and an inverted feedback signal 115. A mode selection bit (MSB) 120 is received at the first multiplexer 105. An output of the first multiplexer 105 is received by a flip-flop 125. The flip-flop 125 generates a scan pattern on line 130. A plurality of logic circuits 135 generates a logic output on line 140 in response to the scan pattern received on line 130. The plurality of logic circuits 135 is connected in a scan chain. In one of the embodiments, the plurality of logic circuits 135 is any sequential circuit known in the art such as flip-flops. The length of the scan chain is defined by the number of logic circuits connected sequentially. In one embodiment, if the number of flip flops connected in scan chain is 10, then the scan chain length is 10. The inverter 145 generates the inverted feedback signal 115 in response to the scan pattern on line 130. A bypass multiplexer 142 is coupled to the plurality of logic circuits 135 and receives the logic output on line 140. The bypass multiplexer 142 also receives the scan data input SI 110. The bypass multiplexer 142 also receives a segment bypass input SB 112. The segment bypass input SB 112 includes at least one of a group control input (GC), a row control input (RC) and a column control input (CC). The bypass multiplexer 142 generates a scan output SO on line 148 in response to the logic output on line 140, the segment bypass input SB 112 and the scan data input SI 110. A divider (DIV) 150 receives a scan clock (SC) 155 and a divider control signal (DIV control) 165. The divider (DIV) 150 generates a divided scan clock 160 responsive to the value of the divider control signal (DIV control) 165. The flip-flop 125 receives the divided scan clock 160. In one embodiment, the divider 150 receives the divider control signal (DIV control) 165 and generates a variable divided scan clock from the scan clock (SC) 155. The flip-flop 125 receives the variable divided scan clock.

The operation of the circuit 100 illustrated in FIG. 1 is explained now. The first multiplexer 105 selects either the scan data input SI 110 or the inverted feedback signal 115 in response to the mode selection bit (MSB) 120. The first multiplexer 105 works in a toggle mode or a scan chain mode based on the MSB 120. The toggle mode is used during diagnosis of the plurality of logic circuits 135. The scan chain mode is used for normal operation of the plurality of logic circuits 135. The first multiplexer 105 generates a multiplexed output and the flip-flop 125 receives the multiplexed output from the first multiplexer 105. The flip-flop 125 generates a scan pattern on line 130 in response to the multiplexed output from the first multiplexer 105 and the divided scan clock 160 received from the divider (DIV) 150. In one embodiment, the divider (DIV) 150 generates the variable divided scan clock which is provided to the flip-flop 125. The flip-flop 125 generates a set of scan pattern in response to the variable divided scan clock. Table 1 illustrates the type of scan patterns generated for different combination of MSB 120 and the divider control signal (DIV control) 165.

TABLE 1

| Mode selection bit | Flip-Flop | Divider control signal | Comments | Scan Pattern |
|---|---|---|---|---|
| 0 | Apply clock pulse | 00 | Normal scan shift operation | Scan input pattern |
| 1 | Apply reset pulse | 00 | Hold the clock of flip-flop and apply number of clock equal to scan chain length | All 0 |
| 1 | Apply one clock pulse | 00 | Hold the clock of flip-flop and apply number of clock equal to scan chain length | All 1 |
| 1 | Apply reset pulse | 01 | Pulse the clock of flip-flop and apply number of clock equal to scan chain length | 10101010 |
| 1 | Apply one clock pulse | 01 | Pulse the clock of flip-flop and apply number of clock equal to scan chain length | 01010101 |
| 1 | Apply reset pulse | 10 | Pulse the clock of flip-flop and apply number of clock equal to scan chain length | 110011001100 |
| 1 | Apply one clock pulse | 10 | Pulse the clock of flip-flop and apply number of clock equal to scan chain length | 001100110011001 |
| 1 | Apply reset pulse | 11 | Pulse the clock of flip-flop and apply number of clock equal to scan chain length | 111000111000111 |
| 1 | Apply one clock pulse | 11 | Pulse the clock of flip-flop and apply number of clock equal to scan chain length | 000111000111000 |

The plurality of logic circuits 135 generates the logic output on line 140 in response to the scan pattern received on line 130. The bypass multiplexer 142 receives the logic output on line 140 and the scan data input SI 110 and generates the scan output SO on line 148. The plurality of logic circuits 135 is identified as defective if the scan output SO on line 140 is different from a predefined scan output. In one embodiment, the predefined scan output is defined by a user. In an embodiment, the predefined scan output is selected to achieve optimal performance of circuit 100. The scan output SO on line 148 is equal to the scan data input SI 110 when the plurality of logic circuits 135 is identified as defective and the scan output SO on line 148 is equal to logic output on line 140 when the plurality of logic circuits 135 is identified as non-defective. At least one of the group control input, the row control input and the column control input in the segment bypass input SB 112 is configured to be activated to bypass the plurality of logic circuits 135 if identified as defective. The predefined scan output is based on the scan pattern received by the plurality of logic circuits 135. In one of the embodiments, a set of scan outputs is generated in response to the set of scan patterns. The scan pattern on line 130 is provided to the inverter 145. The output of the inverter 145 is the inverted feedback signal 115 which is provided as feedback to the first multiplexer 105.

Figure 2:
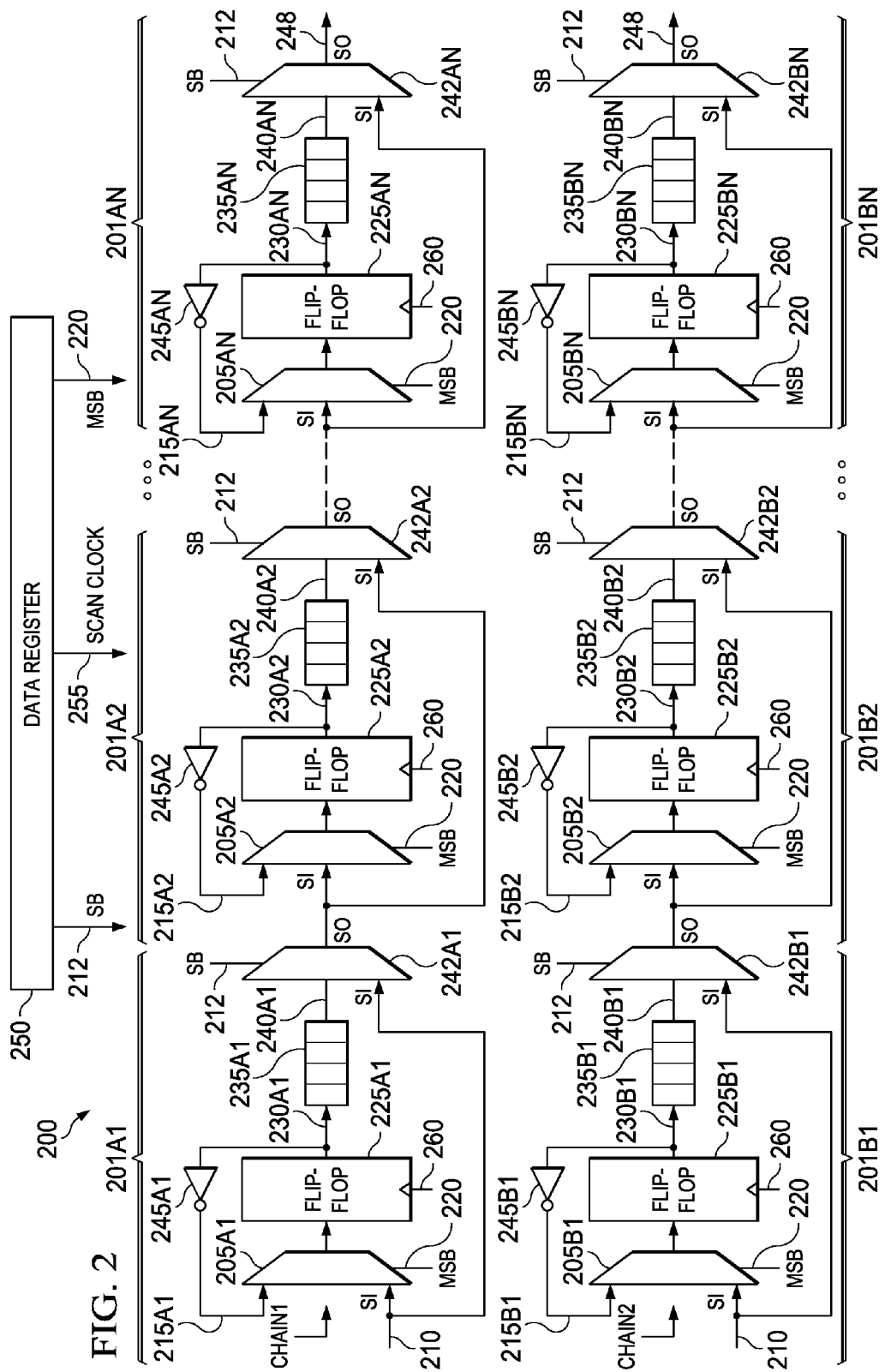
FIG. 2 illustrates a schematic of scan chain architecture for diagnosing a plurality of logic circuits, according to an embodiment.

FIG. 2 illustrates a schematic of scan chain architecture 200 for diagnosing a plurality of logic circuits according to an embodiment. The scan chain architecture 200 includes a plurality of segments 201A1, 201A2, 201AN, 201B1, 201B2 and 201BN. The segments 201A1, 201A2, 201AN are part of chain 1 while segments 201B1, 201B2 and 201BN are part of chain 2. In one of the embodiments, the scan chain architecture 200 includes plurality of chains. The segments 201AN and 201BN are $N^{th}$ segments in the respective chains, where N is an integer greater than or equal to 1. Each segment of the plurality of segments includes a first multiplexer, a flip-flop, an inverter, a plurality of logic circuits and a bypass multiplexer. For example, the segment 201A1 includes a first multiplexer 205A1, a flip-flop 225A1, a plurality of logic circuits 235A1 arranged in scan chain, a bypass multiplexer 242A1 and an inverter 245A1. Similarly, the segment 201AN includes a first multiplexer 205AN, a flip-flop 225AN, a plurality of logic circuits 235AN arranged in scan chain, a bypass multiplexer 242AN and an inverter 245AN. For the sake of simplicity, the segment 201A1 is explained in detail. It is understood that 201A1 and other segments are similar in connection and operation. The first multiplexer 205A1 receives a scan data input SI 210 and an inverted feedback signal 215A1. In one embodiment, the scan data input received by segment 201A1 is different from a scan data input received by segment 201B1. A mode selection bit 220 is received at first multiplexer 205A1 from a data register 250. It is to be noted that the first multiplexers 205A2, 205AN, 205B1, 205B2 and 205BN receive a mode selection bit 220 that is predefined in the data register 250. In one of the embodiment, different values of mode selection bit are defined for first multiplexers 205A2, 205AN, 205B1, 205B2 and 205BN. The output of the first multiplexer 205A1 is received by a flip-flop 225A1. The flip-flop 225A1 generates a scan pattern on line 230A1. A plurality of logic circuits 235A1 generates a logic output on line 240A1 in response to the scan pattern received on line 230A1. The plurality of logic circuits 235A1 is connected in scan chain. In one of the embodiments, the plurality of logic circuits 235A1 is any sequential circuit known in the art such as flip-flops. The inverter 245A1 generates the inverted feedback signal 215A1 in response to the scan pattern on line 230A1. A bypass multiplexer 242A1 is coupled to the plurality of logic circuits 235A1 and receives the logic output on line 240A1. The bypass multiplexer 242A1 also receives the scan data input SI 210. The bypass multiplexer 242A1 also receives a segment bypass input SB 212 from the data register 250. It is to be noted that the bypass multiplexers 242A2, 242AN, 242B1, 242B2 and 242BN receive a segment bypass input SB 212 that is predefined in the data register 250. In one of the embodiment, different values of segment bypass input SB 212 are defined for bypass multiplexers 242A2, 242AN, 242B1, 242B2 and 242BN. The segment bypass input SB 212 includes at least one of a group control input (GC), a row control input (RC) and a column control input (CC). The bypass multiplexer 242A1 generates a scan output SO in response to the logic output on line 240A1, the scan data input SI 210 and the segment bypass input SB 212. The scan output SO of one segment is received as the scan data input SI of a next segment of the plurality of segments. For example, the scan output SO of segment 201A1 is the scan data input SI of the next segment 201A2. The $N^{th}$ segments 201AN and 201BN generate a scan output SO 248. In one embodiment, the $N^{th}$ segment in each chain generates a different scan output SO. The flip-flop 225A1 receives a divided scan clock 260. In one embodiment the flip-flop 225A1 receives a variable divided scan clock. At least one of the segments of the plurality of segments includes a divider (not illustrated in FIG. 2) configured to generate a divided scan clock 260 in response to the scan clock 255 received from the data register 250. The flip-flop is configured to generate the scan pattern in response to the divided scan clock 260. In one embodiment, the divider is a variable divider that generates a variable divided scan clock in response to the scan clock 255 received from the data register 250. The flip-flop generates a set of scan patterns in response to the variable divided scan clock.

The operation of the scan chain architecture 200 illustrated in FIG. 2 is explained now with the help of the segment 201A1. It is understood that segment 201A1 and other segments are similar in connection and operation. The first multiplexer 205A1 selects either the scan data input SI 210 or the inverted feedback signal 215A1 in response to the mode selection bit (MSB) 220. The first multiplexer 205A1 works in a toggle mode or a scan chain mode based on the MSB 220. In one embodiment, the MSB 220 is used to selectively enable a set of first multiplexers of the plurality of first multiplexers 205A2, 205AN, 205B1, 205B2 and 205BN to work in toggle mode. The toggle mode is used during diagnosis of the plurality of logic circuits 235A1. The scan chain mode is used for normal operation of the plurality of logic circuits 235A1. The first multiplexer 205A1 generates a multiplexed output and the flip-flop 225A1 receives the multiplexed output from the first multiplexer 205A1. The flip-flop 225A1 generates a scan pattern in response to the multiplexed output from the first multiplexer 205A1 and the divided scan clock 260. In one embodiment, the flip-flop 225A1 generates a set of scan pattern in response to the variable divided scan clock. In one embodiment, each segment of the plurality of segments is fed with different scan patterns to debug the defects in a large scan chain architecture. The plurality of logic circuits 235A1 generates the logic output on line 240A1 in response to the scan pattern received on the line 230A1. The bypass multiplexer 242A1 receives the logic output on line 240A1 and the scan data input SI 210 and generates the scan output SO. The plurality of logic circuits 235A1 is identified as defective if the scan output SO is different from a predefined scan output. In one embodiment, the predefined scan output is defined by a user. In an embodiment, the predefined scan output is selected to achieve optimal performance of scan chain architecture 200. The scan output SO is equal to the scan data input SI 210 when the plurality of logic circuits 235A1 is identified as defective and the scan output SO is equal to logic output on line 240A1 when the plurality of logic circuits 235A1 is identified as non-defective. At least one of the group control input, the row control input and the column control input in the segment bypass input SB 212 is configured to be activated to bypass the plurality of logic circuits 235A1 if identified as defective. In one of the embodiments, a set of predefined scan outputs are generated in response to the set of scan patterns. In one embodiment, the group control input, the row control input and the column control input in the segment bypass input SB 212 selectively bypass the segments that are identified as defective in the plurality of segments 201A1, 201A2, 201AN, 201B1, 201B2 and 201BN. Thus, the defective segments are bypassed while the rest of the scan chain architecture remains functional.

Figure 3:
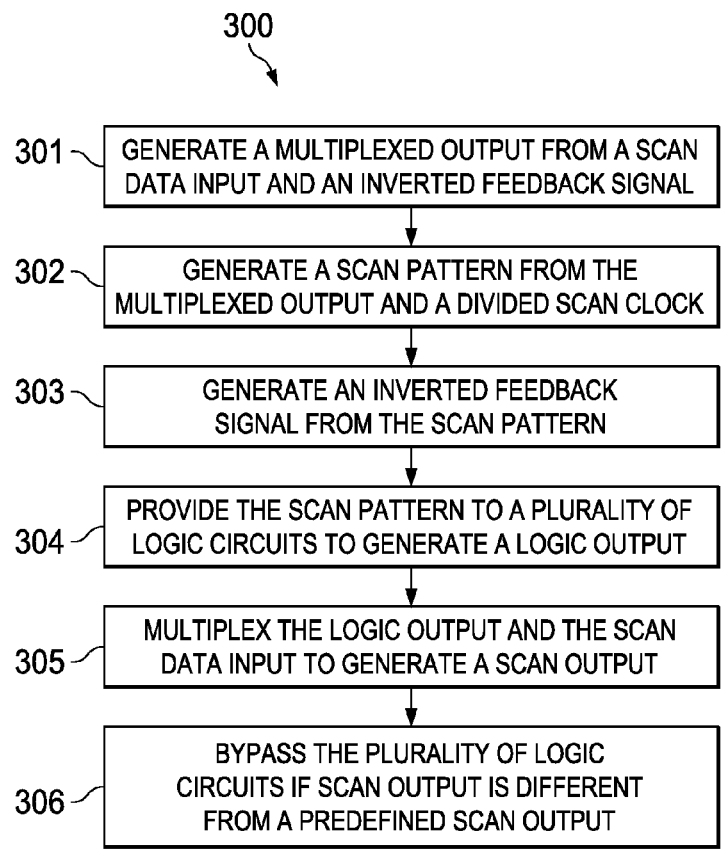
FIG. 3 is a flowchart illustrating a method of diagnosing a plurality of logic circuits arranged in a scan chain, according to an embodiment.

FIG. 3 is a flowchart 300 illustrating a method of diagnosing a plurality of logic circuits arranged in a scan chain, according to an embodiment. At step 301, a multiplexed output is generated by a first multiplexer, for example first multiplexer 105 in FIG. 1, from a scan data input and an inverted feedback signal. The first multiplexer 105 selects either the scan data input or the inverted feedback signal in response to a mode selection bit. The first multiplexer 105 works in toggle mode or scan chain mode based on the mode selection bit 120. The toggle mode is used during diagnosis of the plurality of logic circuits. The scan chain mode is used for normal operation of the plurality of logic circuits. At step 302, the multiplexed output and a divided scan clock are fed to a flip-flop, for example flip-flop 125, to generate a scan pattern. At step 303, an inverter, for example inverter 145, receives the scan pattern and generates an inverted feedback signal which is provided as feedback to the first multiplexer 105. The plurality of logic circuits generates a logic output in response to the scan pattern at step 304. At step 305, the logic output and the scan data input are multiplexed in a bypass multiplexer, for example bypass multiplexer 142, to generate a scan output. The plurality of logic circuits is identified as defective and bypassed if the scan output is different from a predefined scan output at step 306. A segment bypass input is provided to the bypass multiplexer. The segment bypass input includes at least one of a group control input, a row control input and a column control input. At least one of the group control input, the row control input and the column control input is configured to be activated to bypass the plurality of logic circuits if identified as defective.

Figure 4:
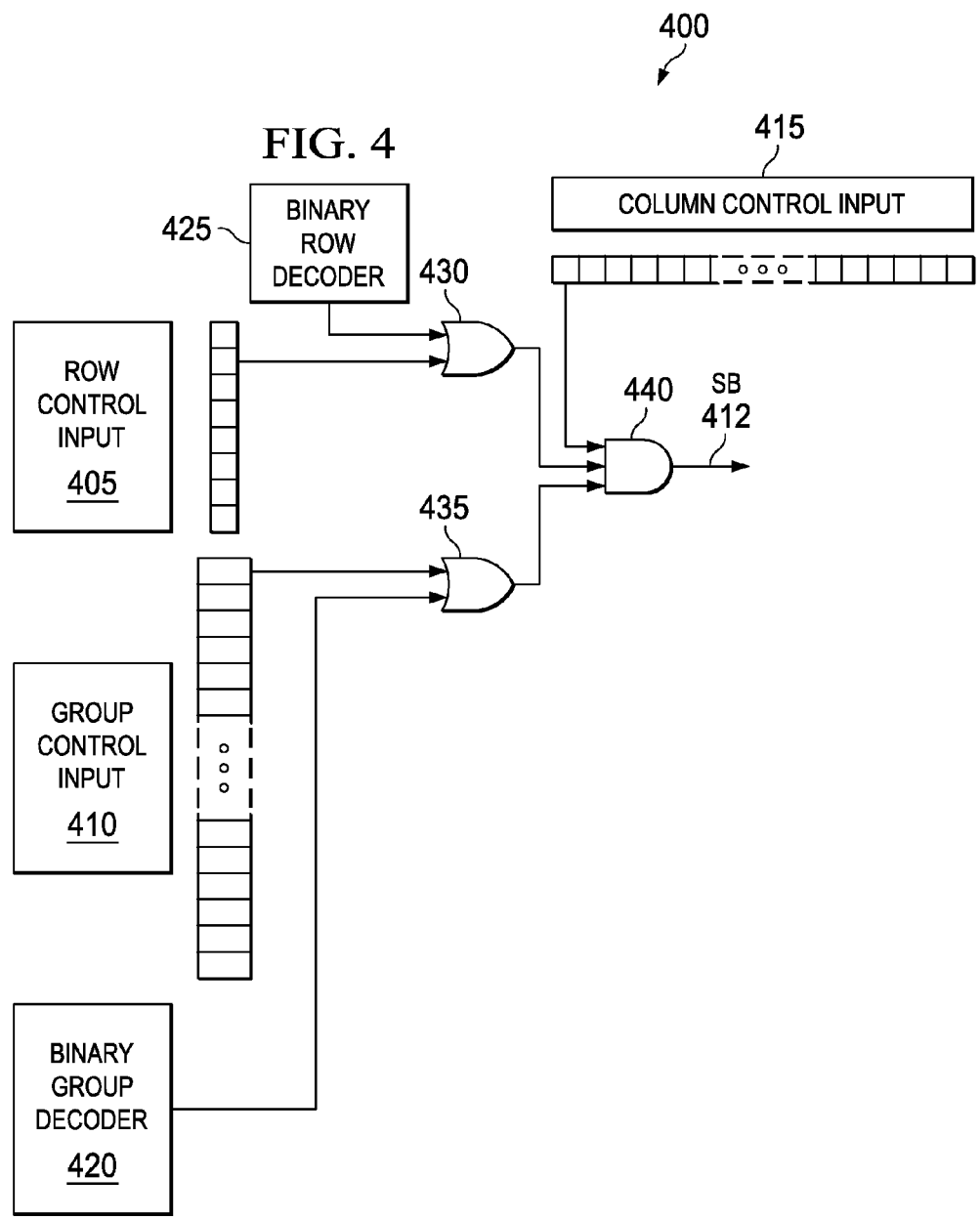
FIG. 4 illustrates a schematic of a circuit for generating a segment bypass input, according to an embodiment.

FIG. 4 illustrates a schematic of a circuit 400 for generating a segment bypass input SB, according to an embodiment. It is to be noted that circuit 400 is one of the ways of generating a segment bypass input SB and it can be implemented in a variety of ways using other circuit components. The circuit 400 includes a row control input 405, a group control input 410 and a column control input 415. A binary group decoder 420 is used to select one segment of the plurality of segments in the scan chain architecture for example scan chain architecture 200. For example, the binary group decoder 420 is used to select one segment of the plurality of segments 201A1, 201A2, 201AN, 201B1, 201B2 and 201BN (illustrated in FIG. 2). A binary row decoder 425 is used to select one chain in the scan chain architecture for example scan chain architecture 200. The binary row decoder 425 is used to select either of chain1 or chain2 in the scan chain architecture 200. The row control input 405 and output of the binary row decoder 425 is received by OR gate 430. The group control input 410 and the output of binary group decoder 420 is received by OR gate 435. An AND gate 440 receives output of OR gate 430, output of OR gate 435 and column control input 415. The output of AND gate 440 is the segment bypass input SB 412 which is provided to a bypass multiplexer, for example bypass multiplexer 142(illustrated in FIG. 1). The bypass multiplexer bypasses the segment if plurality of logic circuits is identified as defective. For example, in scan chain architecture 200, the segment 201B1 is bypassed if the plurality of logic circuits 235B1 is identified as defective.

In the foregoing discussion, the terms "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal. Also, the terms "coupled to" or "couples with" (and the like) are intended to describe either an indirect or direct electrical connection. Thus, if a first device is coupled to a second device, that connection can be through a direct electrical connection, or through an indirect electrical connection via other devices and connections. Further, the term "high" is generally intended to describe a signal that is at logic state "1," and the term "low" is generally intended to describe a signal that is at logic state "0." The term "on" applied to a transistor or group of transistors is generally intended to describe gate biasing to enable current flow through the transistor or multiple transistors.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of the above teachings, and it is thus intended that the scope of invention not be limited by this Detailed Description, but only by the following Claims.

What is claimed is:

1. A circuit comprising:
a first multiplexer configured to receive a scan data input;
a flip-flop coupled to an output of the first multiplexer, configured to generate a scan pattern;
an inverter configured to generate an inverted feedback signal in response to the scan pattern, wherein the inverted feedback signal is provided to the first multiplexer;
a plurality of logic circuits connected in a scan chain and configured to generate a logic output in response to the scan pattern; and
a bypass multiplexer coupled to the plurality of logic circuits, the bypass multiplexer configured to generate a scan output in response to the logic output, the scan data input and a segment bypass input.

2. The circuit of claim 1 further comprising a divider configured to generate a divided scan clock in response to a scan clock, wherein the flip-flop is configured to generate the scan pattern in response to the divided scan clock.

3. The circuit of claim 2, wherein the divider is a variable divider configured to generate a variable divided scan clock in response to the scan clock, wherein the flip-flop is configured to generate a set of scan patterns in response to the variable divided scan clock.

4. The circuit of claim 1, wherein the segment bypass input comprises at least one of a group control input, a row control input and a column control input.

5. The circuit of claim 1, wherein the plurality of logic circuits is identified as defective in response to the scan output when the scan output is different from a predefined scan output.

6. The circuit of claim 1, wherein at least one of the group control input, the row control input and the column control input is configured to be activated to bypass the plurality of logic circuits, if identified as defective in response to the scan output.

7. The circuit of claim 1, wherein the scan output is equal to the scan data input when the plurality of logic circuits is identified as defective and the scan output is equal to the logic output when the plurality of logic circuits is identified as non-defective.

8. The circuit of claim 1, wherein the first multiplexer is configured to receive a mode selection bit to select between a toggle mode and a scan chain mode.

9. A scan chain architecture comprising:
a plurality of segments, each segment comprising a plurality of logic circuits connected in a scan chain, at least one of the segments comprising:
a first multiplexer configured to receive a scan data input;
a flip-flop coupled to an output of the first multiplexer, configured to generate a scan pattern;
an inverter configured to generate an inverted feedback signal in response to the scan pattern, wherein the inverted feedback signal is provided to the first multiplexer;
a plurality of logic circuits connected in a scan chain and configured to generate a logic output in response to the scan pattern; and
a bypass multiplexer coupled to the plurality of logic circuits, the bypass multiplexer configured to generate a scan output in response to the logic output, the scan data input and a segment bypass input.

10. The scan chain architecture of claim 9, wherein the scan output of one segment is received as the scan data input of a next segment in the plurality of segments.

11. The scan chain architecture of claim 9 further comprising a data register configured to generate the segment bypass input, a scan clock and a mode selection bit corresponding to each segment of the plurality of segments.

12. The scan chain architecture of claim 9, wherein the segment bypass input comprises at least one of a group control input, a row control input and a column control input.

13. The scan chain architecture of claim 12, wherein responsive to the scan output of a segment, at least one of the group control input, the row control input and the column control input is activated to selectively bypass the segment of the plurality of segments if the scan output of the segment is different from a predefined scan output.

14. The scan chain architecture of claim 9, wherein the first multiplexer is configured to receive the mode selection bit to select between a toggle mode and a scan chain mode.

15. The scan chain architecture of claim 9, wherein at least one of the segments further comprises a divider configured to generate a divided scan clock in response to the scan clock, wherein the flip-flop is configured to generate the scan pattern in response to the divided scan clock.

16. The scan chain architecture of claim 15, wherein the divider is a variable divider configured to generate a variable divided scan clock in response to the scan clock, wherein the flip-flop is configured to generate a set of scan patterns in response to the variable divided scan clock.

17. A method comprising:
multiplexing a scan data input and an inverted feedback signal to generate a multiplexed output;
generating a scan pattern from the multiplexed output and a divided scan clock, wherein the inverted feedback signal is generated from the scan pattern;
providing the scan pattern to a plurality of logic circuits arranged in a scan chain, wherein the plurality of logic circuits is configured to generate a logic output;
multiplexing the logic output and the scan data input to generate a scan output; and
bypassing the plurality of logic circuits if the scan output is different from a predefined scan output.

18. The method of claim 17 further comprising generating the divided scan clock from a scan clock.

19. The method of claim 17, wherein multiplexing the logic output and the scan data input further comprises the scan output being equal to the scan data input when the plurality of logic circuits is identified as defective and the scan output being equal to the logic output when the plurality of logic circuits is identified as non-defective.

20. The method of claim 17 further comprising a flip-flop configured to generate the scan pattern in response to the multiplexed output and the divided scan clock.

* * * * *